(12) United States Patent
Matsuda et al.

(10) Patent No.: US 6,333,215 B1
(45) Date of Patent: *Dec. 25, 2001

(54) METHOD FOR MANUFACTURING A SEMICONDUCTOR DEVICE

(75) Inventors: Tetsuo Matsuda, Gumma-ken; Nobuo Hayasaka, Yokosuka, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/098,470

(22) Filed: Jun. 17, 1998

(30) Foreign Application Priority Data

Jun. 18, 1997 (JP) .................................... 9-161250

(51) Int. Cl.[7] ..................................... H01L 21/00
(52) U.S. Cl. ........................ 438/149; 438/459; 438/778; 438/458; 438/977
(58) Field of Search ..................... 438/149, 406, 438/628, 644, 654, 660, 661, 678, 778, 635, 455–459, 906, 977; 148/DIG. 135

(56) References Cited

U.S. PATENT DOCUMENTS

| | | | |
|---|---|---|---|
| 3,695,956 | * 10/1972 | Speers | 438/406 |
| 3,909,332 | * 9/1975 | Yerman | 438/406 |
| 4,983,251 | * 1/1991 | Haisma et al. | 438/3 |
| 5,346,848 | * 9/1994 | Grupen-Shemansky et al. | 438/406 |
| 5,366,923 | * 11/1994 | Beyer et al. | 438/406 |
| 5,399,231 | * 3/1995 | McCarthy | 438/406 |
| 5,863,832 | * 1/1999 | Doyle et al. | 438/622 |
| 5,953,620 | * 9/1999 | Katou et al. | 438/406 |

FOREIGN PATENT DOCUMENTS

| | | |
|---|---|---|
| 1-302837 | 12/1989 | (JP) |
| 2-202023 | 8/1990 | (JP) |

OTHER PUBLICATIONS

Wolf et al , "Oxidation Kinetics", 1986, "Silicon Processing for the VLSI Era: vol. 1–Process Technology", 200–201.*

* cited by examiner

Primary Examiner—Carl Whitehead, Jr.
Assistant Examiner—Jamie L. Brophy
(74) Attorney, Agent, or Firm—Finnegan, Henderson, Farabow, Garrett, & Dunner, L.L.P.

(57) ABSTRACT

A method of manufacturing a semiconductor device, which comprises the steps of subjecting a solid material to a first treatment consisting of a thermal treatment and/or a chemical treatment thereby to obtain a treated solid material having desired properties, and adhering the treated solid material onto a substrate for the semiconductor device, thereby to form a thin film on the substrate.

30 Claims, 3 Drawing Sheets

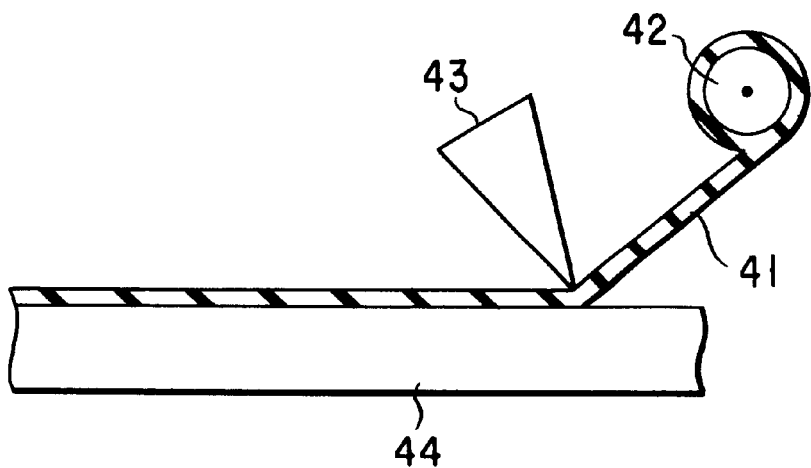
F I G. 4
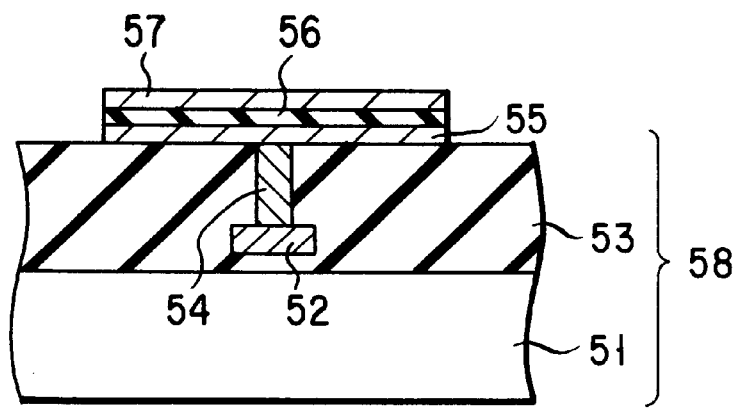
F I G. 5

METHOD FOR MANUFACTURING A SEMICONDUCTOR DEVICE

BACKGROUND OF THE INVENTION

This invention relates to a method for manufacturing a semiconductor device, and in particular to a method for manufacturing a semiconductor device where the formation of a thin film is involved.

An upper limit in temperature and the controlling of atmosphere in the process of manufacturing a semiconductor device are both important parameters influencing the quality of the resultant device. For example, although aluminum has been employed for a multilayer interconnection of an integrated circuit, the upper limit in processing temperature in subsequent to the formation of aluminum wirings is required to be set to 450 to 500° C. or less, since the melting point of aluminum is relatively low. On the other hand, it is important that the metal oxides to be employed as an electrode material of high dielectric constant should be precisely controlled in composition. It is well known however that the metal oxides may be badly deteriorated in quality as they are exposed to an oxidizing atmosphere.

Meantime, as far as the formation of a thin film is concerned, various heat treatments and chemical reaction processes for modifying the characteristics of the thin film or for stabilizing the quality of the thin film should be positively employed. However, since various processes are successively performed on the surface of a substrate in the manufacture of a semiconductor device, a heat treatment or chemical treatment (such as an oxidizing treatment, a reducing treatment or an acid treatment) of a thin film formed on the substrate may cause a damage to the structure, etc. of underlying layers, so that it is frequently impossible to perform such treatments. Followings are typical examples of such a case.

When an aluminum multilayer interconnection is to be formed, an interlayer insulating film is interposed between the wiring layers for insulating the wiring layers from each other. This interlayer insulating film is required to be excellent in moisture resistance, in electrical insulating properties and in step-covering properties.

An $SiO_2$-based insulating film is commonly employed as this interlayer insulating film. An $SiO_2$-based insulating film of high quality is generally formed by means of a chemical vapor deposition method making use of a thermal reaction. For example, the insulating film may be formed employing tetraethoxy silane as a source gas at a reaction temperature of 650° C. or more. However, when a substrate bearing an aluminum wiring layer thereon is subjected to such a high temperature treatment, the aluminum wiring layer may be melted away thus making the aluminum wiring layer incapable of functioning as a wiring.

In view of this problem, there has been tried to employ other energy means such as plasma excitation so as to lower the processing temperature. However, the process employing means such as plasma is accompanied with a problem that the resultant film may be contaminated with reaction products of various kinds. Furthermore, there is a problem that the quality of the resultant film may be greatly affected by a non-uniformity of plasma. Because of these reasons, an insulating film to be formed by means of a plasma excitation for instance is poor in quality as compared with an $SiO_2$-based insulating film to be obtained through a high temperature thermal decomposition. There has been also proposed, with a view to overcome this problem, to apply a heat treatment or an oxidizing treatment to an insulating film that has been formed by means of plasma excitation, etc. However, since the upper limit in temperature in such treatments is at most 450° C., it is still impossible to obtain a sufficient effect.

As explained above, the application of a thermal treatment or a chemical treatment to a thin film is effective in providing the thin film formed on a semiconductor substrate with a desired property so as to obtain a thin film of high quality. However, since a heat treatment or chemical treatment of a thin film may cause a damage to other materials or structures of underlying layers, it has been frequently impossible to perform such treatments, thus making it difficult to form a thin film of high quality.

BRIEF SUMMARY OF THE INVENTION

Therefore, an object of this invention is to provide a method of manufacturing a semiconductor device, which is capable of forming a thin film having a desired property without badly affecting the materials or structures of underlying layers.

Namely, this invention provides a method of manufacturing a semiconductor device, which comprises the steps of:

subjecting a solid material to a first treatment consisting of a thermal treatment and/or a chemical treatment thereby to obtain a treated solid material having desired properties; and adhering the treated solid material onto a substrate for the semiconductor device, thereby to form a thin film on the substrate.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a schematic view illustrating still another example of method of manufacturing a semiconductor device according to this invention; and FIG. 5 is a cross-sectional view illustrating one example of the structure of FRAM manufactured according to a method of this invention.

DETAILED DESCRIPTION OF THE INVENTION

Figure 1A:
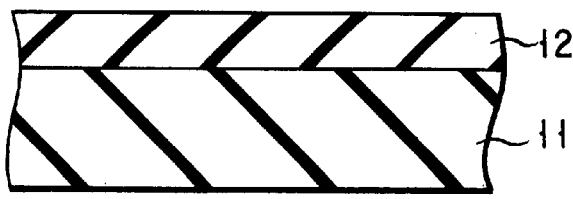
FIGS. 1A to 1C illustrate respectively a crosssectional view illustrating one example of the manufacturing steps of a semiconductor device according to this invention.

This invention will be further explained in details as follows.

The method of manufacturing a semiconductor device according to this invention is featured in that a solid material to be employed as a source gas for a thin film is subjected to a preliminary treatment to provide it with a desired characteristic prior to the formation of the thin film on the surface for a substrate for the semiconductor device.

The preliminary treatment, i.e. a first treatment is performed by subjecting a solid material to a thermal treatment or a chemical treatment. This chemical treatment includes an oxidizing treatment, a reducing treatment and an acid treatment. The conditions for these thermal treatment and chemical treatment may be optionally selected depending on the kinds of the solid material and on the properties desired.

The properties desirable for the solid material that may be effected in the aforementioned first treatment include a thermal stability, a chemical stability, an electric property, an optical property and a mechanical strength.

According to the method of this invention, the solid material provided with any of these properties is adhered onto a substrate for a semiconductor device thereby to form a thin film.

As for the substrate for a semiconductor device on which the thin film is to be formed may be any kind of substrate as long as it can be ultimately utilized as a substrate of a semiconductor device. The substrate may be those provided in advance with an active element, a wiring layer or an insulating film. Alternatively, the substrate for a semiconductor device may be those which can be provided with an active element, etc. in a subsequent step.

The aforementioned thin film may be an insulating thin film or a conductive thin film such as a metallic thin film. As for the insulating thin film, it may be a silicon dioxide film, a polyimide film, a fluorine-doped silicate glass film, etc. As for the conductive thin film, it may be an aluminum film, a titanium film, a copper film, a tungsten film, a metal silicide, etc.

It is also possible according to this invention to perform a second treatment consisting of a thermal treatment and/or a chemical treatment on the substrate for a semiconductor device on which a thin film has been already formed. In this case, the treatment effect of the first treatment should be equivalent to or higher than the effect that can be obtained by the second treatment.

When the substrate is to be subjected to two steps of thermal treatment according to the aforementioned first and second treatments, the first thermal treatment should be performed at a temperature equivalent to or higher than the temperature in the second thermal treatment.

Since a high temperature treatment, etc. has been finished in advance in the thin film to be formed on the surface of a substrate for a semiconductor device according to the method of this invention, a thin film having any desired property can be formed on the substrate. Thus, it is now possible according to the method of this invention to perform such a thermal or chemical treatment that has been deemed to be impossible to perform after the formation of a thin film on the substrate. Therefore, it is possible to form a thin film having a desired property on a substrate for a semiconductor device without badly affecting the materials or structures of underlying layers.

Next, the solid material that has been treated in advance (i.e. the treated solid material) and is designed to be adhered on a substrate for a semiconductor device according to the method of this invention will be explained in detail hereinafter.

This treated solid material may be a thin material film. By the term "a thin material film", it is intended to mean a continuous film having a thickness ranging from 50 nm (0.05 $\mu$m) to 100 $\mu$m. When this thin material film is to be employed as a treated solid material, a thin film can be formed on the surface of substrate for a semiconductor device by the following three different methods.

(a) First of all, an untreated material film is formed on a dummy substrate and then subjected to the aforementioned first treatment thereby providing the untreated material film with a desired property, thus obtaining a thin material film. Then, this thin material film is adhered onto the surface of a substrate for a semiconductor device, and the dummy substrate is removed, thus forming a thin film having a desired property on the surface of a substrate for a semiconductor device.

As for the dummy substrate, various kinds of substrate such as a silicon substrate, a quartz substrate, an aluminum substrate, a ceramic substrate formed of alumina, etc., and a sapphire substrate can be employed. These dummy substrates can be removed by any suitable means selected depending on the kind of material.

Since a dummy substrate is employed according to this method, it is advantageous in that a thin film can be formed with an increased degree of freedom. Further, the adhesion of the thin film on the surface of a substrate for a semiconductor device can be relatively easily performed.

(b) First of all, an untreated material film is subjected to the aforementioned first treatment thereby obtaining a thin material film. Then, this thin material film is allowed to float in a liquid. Subsequently, this thin material film is allowed to contact with the surface of a substrate for a semiconductor device in the liquid, and then the substrate having this thin film contacted therewith is scooped up into a gaseous phase, thus forming a thin film having a desired property on the surface of a substrate for a semiconductor device.

As for the liquid in which the thin material film is allowed to float, various kinds of liquid such as a silicone, a chemically synthesized oil, a higher alcohol, etc. may be employed.

It is possible according to this method to adhere the thin material film to the substrate with a low stress. This method is also advantageous in that a foreign material can hardly enter into an interface between the thin film and the substrate for a semiconductor device. Further, this method is suited also for a large scale production.

(c) A sheet-like untreated material film is subjected to the aforementioned first treatment thereby obtaining a sheet-like material film. By the term "a sheet-like material film", it is intended to mean a structure of thin film material where the thin film material is formed of a continuous body having an area at least larger than that of the substrate for a semiconductor device and capable of withstanding the mechanical stress in the subsequent step of adhering the film onto the substrate. This sheet-like material film is then adhered onto the surface of a substrate for a semiconductor device in a reduced pressure atmosphere, thus forming a thin film having a desired property on the surface of a substrate for a semiconductor device.

As for the method of adhering the sheet-like material film onto the substrate for a semiconductor device, a method of winding the sheet-like material film around a roller at first and then adhering the sheet-like material film onto the surface of the substrate by making use of a squeegee (a rubbing knife) can be adopted.

Since a sheet-like material film is employed according to this method, this method can be advantageously employed for a large scale production.

When a thin material film is employed as a treated solid material as described above, an adhering medium may be interposed between the thin material film and the surface of a substrate for a semiconductor device prior to the step of adhering a thin material film on the surface of a substrate for a semiconductor device thereby to form a thin film thereon. If a volatile material is employed as an adhering medium in this case, the adhering medium can be conveniently evaporated in a subsequent step.

Further, when a thin material film is employed as a treated solid material, the step of forming a thin film on the surface of a substrate for a semiconductor device by adhering the material film onto the surface of the substrate may be followed by a step of thinning the film thickness of the thin film to a desired degree. For example, the thin film initially having a thickness of 0.5 mm may be thinned to a film thickness of 1 $\mu$m, or the thin film initially having a thickness of 8 $\mu$m may be thinned to a film thickness of 0.3 $\mu$m. The method of thinning the thickness of the thin film can be suitably selected depending on the material, etc. of the thin film. For example, an etching using an acid or an alkali, abrasion or compression working may be adopted.

When a thin material film is employed as a treated solid material as described above, the surface of a substrate for a semiconductor device should desirably be smoothed (flattened) in advance by means of abrasion (polishing, grinding etc.) or cutting in view of improving the adhesivity thereof to the thin material film. However, even if the surface of the substrate is somewhat rugged, little problem would be raised if any sharp steps are smoothed thus making them mild in roughness. Rather, a provision of micro-roughness having a height ranging from several angstroms to several hundred angstroms which is commonly employed as means for improving adhesivity is also effective in improving the adhesivity of the substrate in this case.

It is also possible in this invention to employ fine particles as a treated solid material other than the aforementioned thin material film. By the term "fine particles", it is intended to mean a cluster of several atoms or more, which can be obtained through an entrapment of evapotranspirated metal.

When fine particles are employed as a treated solid material, the fine particles are transported over the surface of a substrate for a semiconductor device under a reduced pressure atmosphere for instance thereby to form a thin film having a desired property on the surface of a substrate for a semiconductor device. This method of employing fine particles is advantageous in that the method is scarcely restricted by the kind of material.

Further, when fine particles are employed as a treated solid material, the step of forming a thin film on the surface of a substrate for a semiconductor device by depositing the fine particles onto the surface of a substrate may be followed by a step of applying a pressure on the surface of the thin film thus formed. When a pressure is applied to the surface of the thin film, the adhesivity of the thin film can be improved.

Next, preferable examples according to this invention will be explained.

First of all, a first specific embodiment of a first example according to this example will be explained with reference to FIGS. 1A to 1C and 2. This first specific embodiment is featured in that a fluorine-containing glass film of low dielectric constant which has been subjected in advance to a high temperature thermal treatment so as to provide it with desired characteristics is formed on the surface of a substrate for a semiconductor device.

First of all, a fluorine-containing glass film 12 was directly formed on an Si substrate 11 by means of a plasma excited CVD method. This Si substrate 11 was a dummy substrate, so that it was employed not for forming a semiconductor device thereon, but simply for forming a fluorine-containing glass film 12 thereon. In this deposition of the fluorine-containing glass film 12, the temperature of the substrate 11 was set to 400° C., monosilane, oxygen and nitrogen trifluoride were employed as source gases, and a high-frequency wave of 13.56 MHz was employed for the plasma discharge.

The fluorine-containing glass film 12 thus formed was found containing 9 atomic % of fluorine in silicon oxide. A silicon oxide film formed through plasma CVD and having such a high concentration of fluorine exhibits a very low dielectric constant (i.e. about 2.5, whereas in the case of fluorine-free silicon oxide, it is about 4), so that this silicon oxide film is very useful as an interlayer insulating film. However, since the fluorine contained in a high concentration in the film is thermally unstable, the fluorine may be desorbed from the film, thus diffusing into a semiconductor device, or being released in the form of gas into an ambient atmosphere as the film is placed in a vacuum apparatus or as a metallic wiring is annealed and causes problem such as corrosion of metal wire, degradation of transistors etc. It is also known that a high concentration of fluorine may induce an increase in hygroscopicity of the film.

Therefore, with a view to stabilize the film, the fluorine-containing glass film 12 was heat-treated at a high temperature. Specifically, the fluorine-containing glass film 12 was heat-treated for one hour in a reduced pressure nitrogen atmosphere of 100 mTorr and at a temperature of 1,100° C. As a result of this heat treatment, unstable fluorine was partially desorbed from the fluorine-containing glass film 12, thus leaving fluorine at a concentration of 7.8 atomic % in the resultant fluorine-containing glass film 12. As a result, the dielectric constant of the resultant fluorine-containing glass film 12 was slightly increased up to 2.7, which was still sufficiently low as an interlayer insulating film.

Figure 1B:
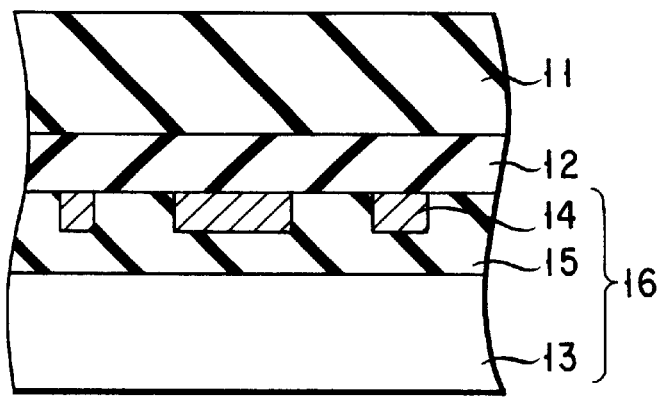

On the other hand, as shown in FIG. 1B, a substrate 16 comprising a silicon substrate 13, on which an active element, an aluminum wiring layer 14 connected with the active element, and an insulating film 15 were formed, was prepared. By the way, the surfaces of the aluminum wiring layer 14 and the insulating film 15 were flattened by means of chemical mechanical polishing, etc.

The fluorine-containing glass film 12 thus obtained was then adhered onto the substrate 16 of a semiconductor device as shown in FIG. 1B. In this case, it is preferable for the purpose of ensuring the adhesion between the fluorine-containing glass film 12 and the insulating film 15, etc. to preliminarily coat an adhesive medium such as silicone, water or alcohol on the surface of the substrate 16. In this specific embodiment, methyl alcohol was employed as an adhesive medium. After finishing the adhesion of the fluorine-containing glass film 12, this methyl alcohol employed as an adhesive medium was allowed to evaporate through annealing, thus removing the methyl alcohol. Specifically, the annealing was performed at a temperature of 450° C. for 30 minutes in an atmospheric nitrogen atmosphere. Through this sequence of steps, it was possible to hermetically and closely adhere the surface of the fluorine-containing glass film 12 onto the surface of the substrate 16 provided with the aluminum wiring 14, etc.

Figure 1C:
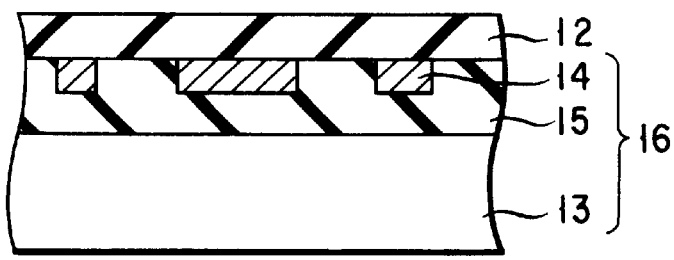

Then, the dummy substrate 11 was removed through an etching by making use of potassium hydroxide, thus obtaining a structure shown in FIG. 1C. Since the fluorine-containing glass film 12 was already stabilized through a heat treatment performed at a temperature of 1,100° C., a phenomenon of fluorine release could no more be recognized in the subsequent processes performed in vacuum or in the subsequent step of annealing (about 450° C.) the aluminum wiring layer 14.

According to the conventional method, the fluorine-containing glass film 12 has been directly formed on the surface of a substrate having an aluminum wiring layer 14 thereon by means of plasma-excited CVD at a low temperature (not more than 450° C.) which would not affect the aluminum wiring layer. Therefore, it has been impossible to obtain a stable fluorine-containing glass film, so that there has been no way other than employing a fluorine-containing glass film containing a reduced amount of fluorine and having a relatively high dielectric constant. Whereas, according to this embodiment, since the fluorine-containing glass film 12 is heat-treated in advance at a temperature of 1,100° C., it is possible to obtain a stable fluorine-containing glass film.

Figure 2:
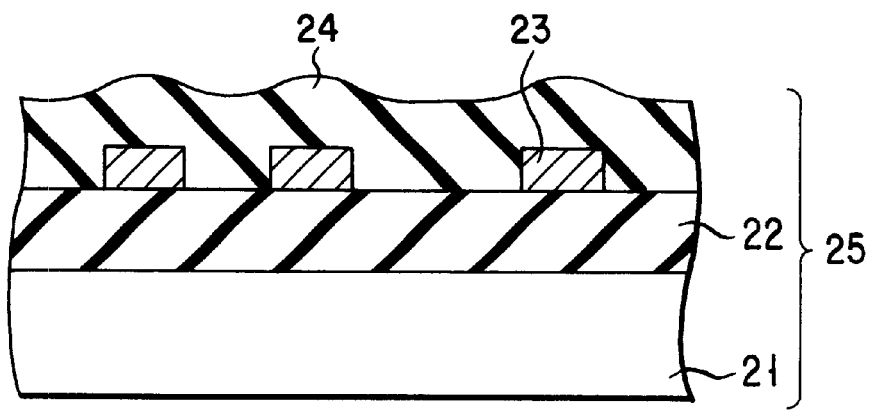
FIG. 2 is a cross-sectional view of one example of the substrate for a semiconductor device to be employed in this invention.

Although the surface of the substrate having an aluminum wiring layer formed thereon was flattened in advance by means of chemical mechanical polishing in the embodiment shown in FIGS. 1A to 1C, the surface of the substrate may not necessarily be completely flattened as long as the adhesivity of the fluorine-containing glass film is assured. For example, it is also possible employ a substrate 25 having a rugged surface as shown in FIG. 2 as a substrate for a semiconductor device. The substrate 25 shown in FIG. 2 was prepared by forming a wiring layer 23 on the surface of a silicon substrate 21 bearing an insulating layer 22 thereon by means of a reactive ion etching and then by depositing a silicon oxide film or an SOG film 24 by means of a chemical vapor deposition method using ozone and an organic silane for instance. In this case, the surface of the silicon oxide film or SOG film 24 is not required to be completely flattened as long as the sharp steps thereof (0.2 μm for instance) are smoothed in a degree.

Next, a second specific embodiment of a first example according to this example will be explained. This second specific embodiment is featured in that a metallic film consisting of aluminum or an aluminum/copper alloy is formed on the surface of a dummy substrate, and then the metallic film is subjected to a predetermined heat treatment so as to provide it with desired characteristics, after which the metallic film is adhered on the surface of a substrate for a semiconductor device.

First of all, an aluminum film was formed on the surface of a quartz substrate employed as a dummy substrate by means of sputtering, and then heated at a temperature of 500° C. for one hour. Subsequently, the aluminum film was gradually cooled over 10 hours. As a result of this heat treatment, the crystals in the aluminum film became huge, thus growing the initial crystal having a diameter of not more than 1 μm as measured immediately after the sputtering up to a crystal having a diameter ranging from several millimeters to several ten millimeters. When the wiring layer of LSI is formed by making use of aluminum of such a large crystal grain, a semiconductor device having a prominently improved reliability can be obtained.

Then, the aluminum film heat-treated for a long time in this manner was adhered onto the surface of a substrate for a semiconductor device, thus forming a high quality aluminum film to be employed as a wiring layer.

It is preferable to form a porous silicon film or a fragile silicon oxide layer on the surface of the quartz substrate prior to the step of forming an aluminum film on the surface of quartz substrate employed as a dummy substrate. Namely, when a porous silicon film or a fragile silicon oxide layer is interposed between the aluminum film and the quartz substrate, it becomes easier to separate the aluminum film from the quartz substrate, thus facilitating the removal of the dummy substrate.

Although it is not suited for use in the manufacture of an LSI due to a high impurity level, an aluminum sheet having an entirely monocrystalline surface may be utilized as a nucleus for the crystallization of the aluminum thin film (polycrystalline). In this case, the aluminum sheet is employed as an underlying layer for promoting the crystallization of aluminum thin film formed thereon.

Since aluminum constituting the aluminum film employed in this embodiment is excellent in ductility and malleability, the aluminum film can be firmly and closely adhered onto the surface of a substrate (for example, a silicon oxide layer) for a semiconductor device. Therefore, there is no need to employ any adhesive layer in the adhesion of the aluminum film on the substrate for a semiconductor device. However, if a more strong adhesion is desired, a titanium thin film may be employed as an adhesive medium. Since titanium is capable of reacting, even if small in quantity, with silicon oxide, it is possible to realize, through an effect of wedging by the titanium, a strong adhesion.

Next, a third specific embodiment of a first example according to this example will be explained. This third specific embodiment is featured in that a porous silicon oxide film which is now attracting attention as a low dielectric constant film is formed on the surface of a dummy substrate, and then subjected to a predetermined heat treatment so as to provide it with desired characteristics, after which the porous silicon oxide film is adhered onto the surface for a semiconductor substrate.

As for the method of forming the porous silicon oxide film, a method of coating a solution containing silicon oxide which has been polymerized and pulverized by means of sol-gel method on a substrate whereby forming a stone wall-like film can be generally employed. The density of the porous silicon oxide film formed in this manner can be reduced to about 50% of the density of bulk silicon oxide. Namely, since the silicon oxide film can be reduced in density thereof, the relative dielectric constant thereof can be also lowered. However, the porous silicon oxide film is large in effective surface area due to its high porosity. Further, since the surface of the porous silicon oxide film is terminated generally with OH group, gases such as moisture in the ambient atmosphere can be easily entrapped in the film. Because of these reasons, the porous silicon oxide film having such features is hardly applicable to an LSI.

Accordingly, the porous silicon oxide film prepared as described above was heat-treated at a high temperature of about 800° C. in the presence of hydrogen so as to reduce the OH group thereby to stabilize the film. According to the conventional process, the porous silicon oxide film is formed on the surface of the substrate where an active element and wiring layer are formed in advance. Therefore, if the porous silicon oxide film formed in this manner is heat-treated at a high temperature in the presence of hydrogen, the metallic film or impurity diffusion layer formed in the substrate may be badly affected. Specifically, the metallic film may be melted away or the diffusion layer may be extended beyond the preset region. Whereas, according to this invention, since the heat treatment of the porous silicon oxide film is performed using a dummy substrate, all of the aforementioned problems can be avoided.

Figure 3:
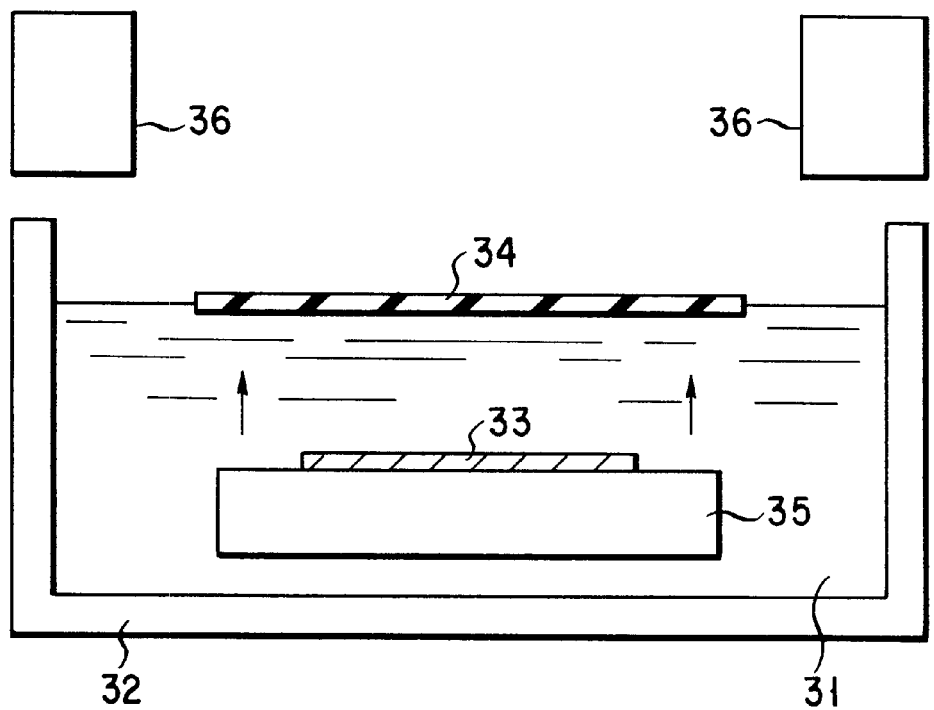
FIG. 3 is a schematic view illustrating another example of method of manufacturing a semiconductor device according to this invention.

Next, a second example according to this example will be explained with reference to FIG. 3. This second example is featured in that a polyimide film which is heat-treated in advance at a high temperature so as to provide it with desired characteristics is adhered onto the surface for a semiconductor substrate.

Polyimide film is extensively utilized as an insulating film for a semiconductor device. As for the method of forming the polyimide film, a spin-coating method is generally employed. The polyimide film formed in this manner however contains part of solvent which are included in a coating solution or molecules of low polymerization degree, so that these foreign materials may be decomposed and evaporated as they are exposed to a high temperature. Therefore, the polyimide film cannot be exposed to a high temperature process, and hence the upper limit of processing temperature is generally considered as being about 350° C. Because of this, the processing of semiconductor device after the formation of polyimide film is thermally restricted, so that it is impossible to perform high temperature processes such as the reflow of metal and the annealing of wiring layer. In view of these problems, a method is adopted in this example wherein a polyimide film heat-treated in advance according to the following method is adhered onto the surface for a semiconductor device.

First of all, polyimide was formed into a film having a thickness of about 30 $\mu$m, the resultant polyimide film being subsequently heat-treated at a temperature of 500° C. thereby to releasing gases contained therein. Subsequently, as shown in FIG. 3, a silicon substrate 33 was placed in a vessel 32 filled with isopropyl alcohol 31, and the polyimide film 34 was allowed to float on the surface of the isopropyl alcohol 31. At this moment, the silicon substrate 33 was already provided with an active element, and the uppermost surface thereof was flattened by means of chemical mechanical polishing. The silicon substrate 33 was mounted on an elevator 35 which was inclined at an angle of about 3 degrees to the liquid level of the isopropyl alcohol 31. Then, the elevator 35 was lifted in perpendicular to the polyimide film 34, thereby allowing the polyimide film 34 to be closely adhered onto the silicon substrate 33. In this manner, the polyimide film 34 could be scooped up on the surface of the silicon substrate 33. Then, the silicon substrate 33 as well as the polyimide film 34 was dried with hot air by means of dryers 36 which were disposed over the vessel 32 filled with the isopropyl alcohol 31. Subsequently, redundant portion of the polyimide film which was protruded out of the silicon substrate 33 was cut away, and at the same time, the polyimide film was polished to obtain a desired thickness thereof. Specifically, the CMP (chemical and mechanical polishing) method was employed to obtain a polyimide film having a thickness of 7 $\mu$m.

The polyimide film obtained in this manner was found stable, i.e. a release of gas or the denaturing of film was not recognized even in a process performed at a temperature of 450° C.

Accordingly, it was possible to perform high temperature processes such as the reflow of metal and the annealing of wiring layer even after the adhesion of the polyimide film onto the substrate.

Next, a third example according to this example will be explained with reference to FIG. 4. In this third example, a sheet-like thin film was formed at first by means of a compression method or the LB method, and then the resultant film was subjected in advance to a high temperature heat treatment so as to provide it with desired characteristics.

This sheet-like thin film 41 provided with desired characteristics was then wound around a roller 42 and then adhered, in a vacuum atmosphere, on the surface of substrate 44 by making use of a squeegee (a rubbing knife) 43. Since a sheet-like material film was employed according to this method, this method can be advantageously employed for a large scale production.

Next, a fourth example according to this example will be explained with reference to FIG. 5. This fourth example is featured in that fine particles employed as a material for forming a thin film are subjected in advance to a predetermined heat treatment so as to provide it with desired characteristics, after which the fine particles are transported on the surface of the substrate thereby to form the thin film. In this example, the formation of a lead-zirconium-titanium oxide film (hereinafter referred to as a PZT film) for a ferroelectric random access memory (FRAM) element will be explained as an example.

The PZT film can be easily shifted of its stoichiometric composition in a reducing atmosphere, thus deteriorating the properties of the FRAM element comprising the PZT film. This can be attributed to the fact that the PZT film is not sufficiently oxidized to meet the stoichiometric composition thereof, thus rendering the PZT film unstable. Therefore, if the PZT film is treated in an oxidizing atmosphere of a high temperature of around 1,100° C., it would be possible to obtain the PZT film which meets the stoichiometric composition thereof and hence is stable. However, according to the ordinary process of manufacturing the FRAM element, an active element such as the FET has been formed on the substrate prior to the formation of the PZT film, so that it has been impossible as a matter of fact to perform a treatment of the PZT film in an oxidizing atmosphere of a high temperature of around 1,100° C., since the treatment at such a high temperature would badly affect the active element, etc. that has been formed in advance.

According to the method of this example, ultrafine particles of lead, zirconium and titanium were mixed together in a ratio which meets the stoichiometric composition (lead, zirconium and titanium=2:1:1) thereby to obtain a PZT particulate composition. In this case, each particle was prepared by making use of a metal fog, the particle diameter thereof being controlled to about 200 angstroms. Then, the PZT particulate composition was oxidized as it was at a high temperature (1,200° C.) thereby to obtain an ideal PZT particulate composition. Subsequently, this PZT particulate composition obtained in this manner was sprayed onto the surface of the substrate and then densified at a low temperature (750° C.) under compression (10 kg/cm$^2$) thereby to obtain a thin film.

On the other hand, as a substrate for a semiconductor device, a substrate 58 comprising a silicon substrate 51 on which an insulating film 53, a MOS transistor 52, a contacting hole 54 and a Pt film to be employed as a lower electrode 55 of capacitor were formed as shown in FIG. 5 was prepared.

Then, the PZT film 56 was formed on the surface of the substrate 58 for a semiconductor device by making use of the aforementioned method. The composition of the PZT film thus formed on the surface of the substrate 58 was found consisted of; lead:zirconium:titanium:oxygen= 2.00:1.00:1.00:3.00, thus indicating an ideal stoichiometric composition. Subsequently, a Pt film to be employed as an upper electrode 57 of capacitor was formed on the PZT film 56, and then the Pt film/PZT film/Pt film was patterned into a predetermined shape. The FRAM thus obtained was found excellent in both element properties and longterm stability.

According to the first to third examples explained above, it is designed that a thin material film which has been prepared in advance is adhered onto the surface of a substrate for a semiconductor device, so that the surface of a substrate should preferably be flattened in advance. On the other hand, in the case of the fourth example, the fine film is formed on the surface of a substrate for a semiconductor device by spraying fine particles onto the surface of the substrate, so that the surface of the substrate needs not necessarily be flattened in advance.

It should be appreciated that this invention is not confined to the aforementioned first to fourth examples, but can be variously modified within the spirit of this invention.

As explained above, it is possible according to this invention to provide a method of manufacturing a semiconductor device, which is capable of forming a thin film having desired properties without badly affecting the material and structure of the underlying layers.

It is now made possible according to the method of this invention to form a high quality thin film through a thermal or chemical treatment of the thin film, which treatments have been considered impossible according to the prior art if these treatments were performed subsequent to the formation of the thin film on the substrate. Therefore, the thin film can be formed with an increased degree of freedom in the manufacturing process thereof. Accordingly, this invention would be very valuable in industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A method of manufacturing a semiconductor device, which comprises the steps of:
    subjecting a solid material to a first thermal treatment to be performed at a first temperature, to obtain a treated solid material having desired properties;
    adhering said treated solid material onto a substrate for the semiconductor device to form a thin film on said substrate; and
    performing a second thermal treatment at a second temperature on said substrate of the semiconductor device, on which said thin film is formed,
    wherein said substrate for the semiconductor device comprises at least one layer and at least one structure; and
    said first temperature is higher than said second temperature and is a temperature which will badly affect said at least one layer and at least one structure of said semiconductor device.

2. The method according to claim 1, wherein said treated solid material is a thin material film.

3. The method according to claim 2, wherein said thin material film is formed on a dummy substrate and then subjected to said first thermal treatment thereby providing said thin material film with a desired property; and
    the step of forming said thin film is performed by adhering said thin material film onto a surface of said substrate for the semiconductor device, said dummy substrate being subsequently removed.

4. The method according to claim 2, which further comprises, prior to the step of forming said thin film, a step of interposing an adhesive medium between said thin material film and said substrate for the semiconductor device.

5. The method according to claim 2, which further comprises, in subsequent to the step of forming said thin film, a step of thinning a film thickness of said thin film to a desired thickness.

6. A method of manufacturing a semiconductor device, which comprises the steps of:
    subjecting a solid material to a first chemical treatment to obtain a treated solid material having desired properties;
    adhering said treated solid material onto a substrate for the semiconductor device to form a thin film on said substrate; and
    performing a second chemical treatment on said substrate for the semiconductor device, on which said thin film is formed,
    wherein a first treatment effect is obtained by said first chemical treatment and a second treatment effect is obtained by said second chemical treatment,
    said substrate for the semiconductor device comprises at least one layer and at least one structure of underlying layers, and
    said first treatment effect badly affects said at least one layer and at least one structure of the underlying layers on said substrate of said semiconductor device.

7. The method according to claim 6, wherein said treated solid material is a thin material film.

8. The method according to claim 7, wherein said thin material film is formed on a dummy substrate and then subjected to said first chemical treatment thereby providing said thin material film with a desired property; and
    the step of forming said thin film is performed by adhering said thin material film onto a surface of said substrate for the semiconductor device, said dummy substrate being subsequently removed.

9. The method according to claim 7, which further comprises, prior to the step of forming said thin film, a step of interposing an adhesive medium between said material film and said substrate for the semiconductor device.

10. The method according to claim 7, which further comprises, in subsequent to the step of forming said thin film, a step of thinning a film thickness of said thin film to a desired thickness.

11. A method of manufacturing a semiconductor device, comprising:
    subjecting a solid material to first treatment conditions to obtain a treated solid material, said first treatment conditions being chosen from a first thermal treatment at a first temperature and a first chemical treatment; and
    adhering the treated solid material onto a substrate to obtain a multi-layer composite;
    wherein the substrate comprises at least one layer and at least one structure, and the at least one structure is unstable under the first treatment conditions.

12. The method of claim 4, wherein the at least one structure comprises a wiring layer.

13. The method of claim 4, wherein the at least one structure comprises metal.

14. The method of claim 4, wherein the at least one structure comprises aluminum.

15. The method of claim 4, wherein said first treatment conditions modify at least one property of said solid material, said property being chosen from a thermal stability, a chemical stability, an electrical property, an optical property, and a mechanical strength of the solid material.

16. The method of claim 4, further comprising subjecting said multi-layer composite to second treatment conditions, wherein said second treatment conditions are chosen from a second thermal treatment at a second temperature and a second chemical treatment.

17. The method of claim 16, wherein said first temperature is greater than said second temperature.

18. The method of claim 4, wherein said treated solid material is a thin material film.

19. The method of claim 18, further comprising floating said thin material film in a liquid; allowing said thin material film to contact a surface of said substrate; and scooping up said substrate from said liquid, said substrate having said thin material film contacted therewith.

20. The method of claim 4, further comprising interposing an adhering medium between said treated solid material and said substrate.

21. The method according to claim 2, wherein the adhering said thin film comprises floating said thin material film in a liquid; contacting in the liquid said thin material film with a surface of the substrate for the semiconductor; and lifting the substrate having said thin film contacted therewith into a gaseous phase.

22. The method according to claim 2, wherein said thin material film is a sheet-like material film; and said adhering said treated solid material comprises adhering said sheet-like material film onto a surface of the substrate for the semiconductor device in a reduced pressure atmosphere.

23. The method according to claim 7, wherein the adhering said thin film is comprises floating said thin material film in a liquid, contacting in the liquid said thin material film with a surface of the substrate for the semiconductor; and lifting the substrate having said thin film contacted therewith into a gaseous phase.

24. The method according to claim 7, wherein said thin material film is a sheet-like material film; and said adhering said treated solid material comprises adhering said sheet-like material film onto a surface of the substrate for the semiconductor device in a reduced pressure atmosphere.

25. The method according to claim 1, wherein said treated solid material is formed of fine particles.

26. The method according to claim 25, wherein said adhering comprises transporting said fine particles onto the substrate for the semiconductor device in a reduced pressure atmosphere.

27. The method according to claim 25, further comprising applying pressure to said thin film.

28. The method according to claim 6, wherein said treated solid material is formed of fine particles.

29. The method according to claim 28, wherein said adhering comprises transporting said fine particles onto the substrate for the semiconductor device in a reduced pressure atmosphere.

30. The method according to claim 28, further comprising applying pressure to said thin film.

* * * * *

UNITED STATES PATENT AND TRADEMARK OFFICE
CERTIFICATE OF CORRECTION

PATENT NO.    : 6,333,215 B1
DATED         : December 25, 2001
INVENTOR(S)   : Tetsuo Matsuda et al.

It is certified that error appears in the above-identified patent and that said Letters Patent is hereby corrected as shown below:

Column 12,
Line 66, "claim 4" should read -- claim 11 --.

Column 13,
Lines 1, 3, 5, 10, 17 and 24, "claim 4" should read -- claim 11 --.

Column 14,
Line 6, "in a liquid," should read -- in a liquid; --.
Line 5, before "comprises", delete "is".

Signed and Sealed this

Third Day of September, 2002

*Attest:*

*Attesting Officer*

JAMES E. ROGAN
*Director of the United States Patent and Trademark Office*